United States Patent [19]
Murakami et al.

[11] Patent Number: 4,972,240
[45] Date of Patent: Nov. 20, 1990

[54] VERTICAL POWER MOS TRANSISTOR

[75] Inventors: Koichi Murakami; Teruyoshi Mihara, both of Yokosuka; Yukitsugu Hirota, Kamakura, all of Japan

[73] Assignee: Nissan Motor Company, Limited, Yokohama, Japan

[21] Appl. No.: 318,569

[22] Filed: Mar. 3, 1989

[30] Foreign Application Priority Data

Mar. 4, 1988 [JP] Japan .................................. 63-49657

[51] Int. Cl.$^5$ ............................................ H01L 29/78
[52] U.S. Cl. ................................ 357/23.4; 357/23.13; 357/55; 357/68
[58] Field of Search .................. 357/23.4, 23.13, 55, 357/68

[56] References Cited

U.S. PATENT DOCUMENTS 4,769,685 9/1988 MacIver et al. .................... 357/23.4
4,837,606 6/1989 Goodman et al. .................. 357/23.4

OTHER PUBLICATIONS

Adolph Blicher, "MOS Power Transistor Design", Field-Effect and Bipolar Power Transistor Physics, Academic Press, 1981, pp. 280-283.

*Primary Examiner*—Edward J. Wojciechowicz
*Attorney, Agent, or Firm*—Foley & Lardner, Schwartz, Jeffery, Schwaab, Mack, Blumenthal & Evans

[57] ABSTRACT

A vertical power MOS transistor, in which a gate oxide film is formed over partial areas of a semiconductor substrate having a first conductivity type, which functions as a drain, a channel region having a second conductivity type formed in the substrate, and a source region having the first conductivity type, formed in the channel region, and a gate electrode is formed on the gate oxide film, in which an insulating film covers the gate electrode, and a source electrode is formed on the insulating film, and in which an ohmic contact electrode is formed on portions of a source region an a channel region, and a coupling member connects the ohmic contact electrode with the source electrode to separate the source electrode from the gate electrode edge portion.

5 Claims, 4 Drawing Sheets

VERTICAL POWER MOS TRANSISTOR

BACKGROUND OF THE INVENTION

1. Field of the Invention

The present invention relates to a vertical power MOS transistor which is capable of preventing a short circuit between gate and source electrodes in the gate electrode edge portion.

2. Description of the Background Art

In FIG. 1, there is shown a conventional power MOS transistor, as disclosed in "Field-Effect and Bipolar Power Transistor Physics", written by Blicher, published by Academic Press, 1981, pp. 280 to 282.

In FIG. 1, an $n^-$-type drain region 7 is formed on a high concentration $n^+$-type substrate 8, and p-type channel regions 2 are formed in the upper surface area of the drain region 7. A pair of $n^+$-type source regions 1 are formed in the right and left portions of the upper surface area of each channel region 2 and a high concentration $p^+$-type region 10 is formed in the upper surface area of the channel region 2 between the source regions 1. An insulating gate oxide film 3 is formed on the surface of the drain region 7 so as to connect the two source regions 1 of the two adjacent channel regions 2, and a gate electrode 4 is formed on the greater portion of the gate oxide film 3 to bridge over the partial areas of the two source regions 1, the two adjacent channel regions 2 and the drain region 7 therebetween through the gate oxide film 3. The gate electrode 4 is completely covered by the insulating film 5 formed on the gate oxide film 3. A source electrode 6 is formed on the entire upper surface of thus the obtained substrate, and thus the source electrode 6 directly contacts the source regions 1 and also contacts the channel regions 2 via the high concentration $p^+$-type regions 10. A drain electrode 9 is attached to the lower surface of the high concentration $n^+$-type substrate 8.

In the vertical power MOS transistor, several thousands to several tens of thousands of cells having the construction described above are connected in parallel.

There is shown in FIG. 2 one cell unit of the vertical power MOS transistor described above. The insulating film 5 is usually obtained by forming a PSG film, which is comprised of a $SiO_2$ film in which phosphor is doped in a high concentration, using the CVD method. However, the PSG film 5 sometimes fails to entirely cover the gate electrode 4, which is usually made of a polycrystalline silicon, resulting in a step coverage failure, i.e., a short circuit portion 100 between the source and gate electrodes 6 and 4 in the gate electrode edge portion.

In such a case, even when the step coverage failure happens, i.e., the PSG film 5 does not cover the entire of the gate electrode 4 in one cell unit, since the source electrode 6 completely covers the upper surface of the trasistor, the short circuit is caused between the source and gate electrodes 6 and 4. That is, the step coverage failure in one cell unit brings about the failure of the whole of the integrated vertical power MOS transistor including several thousands to several tens of thousands of cell units connected in parallel to one another.

In order to prevent this problem, various measures have been proposed. For instance, after the deposition of the PSG film on the gate electrode, the PSG film is reflowed in order to remove the step coverage failure. In this method, since a heat treatment at a high temperature is required, the source regions 1 previously formed are deeply diffused, and this method can not be properly applied to minute processing.

When the phosphor concentration in the PSG film is raised, reflowing can be carried out at a low temperature. However, in this method, the water absorption of the PSG film is extremely increased, and hence the phosphor contained in the PSG film readily changes to phosphoric acid. Accordingly, the corrosion of the aluminum source electrode takes place.

By forming the PSG film thickly it is possible to improve the step coverage failure. However, cracks are likely with a thick PSG film, and further it is difficult to perform the minute processing of contact portions.

SUMMARY OF THE INVENTION

It is therefore an object of the present invention to provide a vertical power MOS transistor, free from the aforementioned defects and disadvantages of the prior art, which is capable of preventing a short circuit between gate and source electrodes in the gate electrode edge portion.

In accordance with one aspect of the present invention, there is provided a vertical power MOS transistor comprising a semiconductor substrate having a first conductivity type, which functions as a drain, a channel region having a second conductivity type, formed in the semiconductor substrate, a source region having the first conductivity type, formed in the channel region, a first insulating film formed over portions of the source region, the channel region and the semiconductor substrate, a gate electrode formed on the first insulating film, a second insulating film for covering the gate electrode formed on the first insulating film, a source electrode formed on the second insulating film, an ohmic contact electrode formed on the portions of the source region and the channel region, and a coupling member for connecting the ohmic contact electrode with the source electrode.

In accordance with another aspect of the invention, there is provided a vertical power MOS transistor comprising a semiconductor substrate having a first conductivity type, which functions as a drain, a channel region having a second conductivity type, formed in the semiconductor substrate, a source region having the first conductivity type, formed in the channel region, a first insulating film formed over portions of the source region, the channel region and the semiconductor substrate, a gate electrode formed on the first insulating film, a second insulating film for covering the gate electrode formed on the first insulating film, a contact connection electrode including a source electrode contact member formed on the second insulating film, an ohmic contact electrode formed on the portions of the source region and the channel region, and a coupling member for connecting the source electrode contact member to the ohmic contact electrode, a third insulating film formed on at least the ohmic contact electrode and the coupling member of the contact connection electrode and the second insulating film, and a source electrode formed on at least the source electrode contact member of the contact connection electrode and the third insulating film.

BRIEF DESCRIPTION OF THE DRAWINGS

The above and other objects, features and advantages of the present invention will more fully appear from the following description of the preferred embodiments with reference to the accompanying drawings, in which.

DESCRIPTION OF THE PREFERRED EMBODIMENTS

Figure 1:
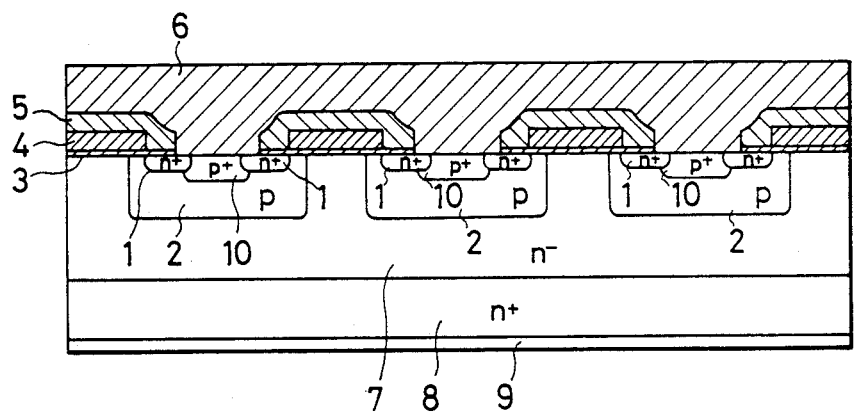
FIG. 1 is a longitudinal cross sectional view of a conventional vertical power MOS transistor.

The present invention will now be described in detail with reference to the accompanying drawings, wherein like reference characters designate like or corresponding parts throughout the several views. There is shown in FIG. 3 a first embodiment of a vertical power MOS transistor according to the present invention.

Figure 3:
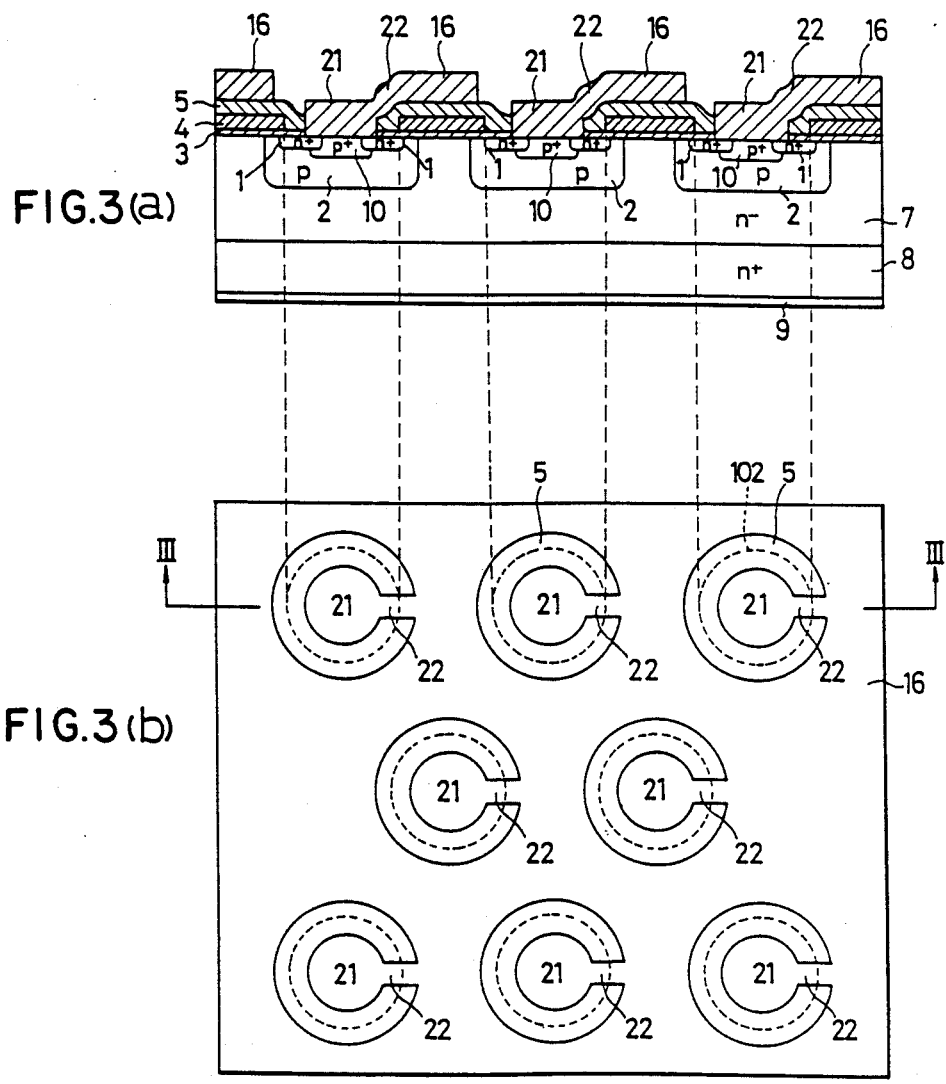
FIGS. 3A and 3B are a longitudinal cross sectional view, taken along the line III—III of a top plan view of one embodiment of a vertical power MOs transistor according to the present invention.

In FIG. 3, an n⁻-type drain region 7 is formed on a high concentration n⁺-type substrate 8, and p-type channel regions 2 are formed in the upper surface area of the drain region 7. A pair of n⁺-type source regions 1 are formed in the right and left portions of the upper surface area of each channel region 2 and a high concentration p⁺-type region 10 is formed in the upper surface area of the channel region 2 between the source regions 1. An insulating gate oxide film 3 is formed on the surface of the drain region 7 so as to connect the two source regions 1 of the two adjacent channel regions 2, and a gate electrode 4 is formed on the greater portion of the gate oxide film 3 to bridge over the partial areas of the two source regions 1, the two adjacent channel regions 2 and the drain region 7 therebetween through the gate oxide film 3. The gate electrode 4 is completely covered by an insulating film 5 formed on the gate oxide film 3. A drain electrode 9 is attached to the lower surface of the high concentration n⁺-type substrate 8. The above described construction is the same as the conventional one shown in FIG. 1.

In this embodiment, a source electrode 16 is formed over the gate electrode 4 via the insulating film 5, and ohmic contact electrodes 21 are formed on the surface portions such as the source regions 1 and the high concentration p⁺-type regions 10, which are not covered by the insulating film 5, and the ohmic contact electrodes 21 are connected to the source electrode 16 through narrow coupling members 22, thereby connecting the source electrode 16 to the source regions 1 and the high concentration p⁺-type regions 10 through the coupling members 22 and the ohmic contact electrodes 21, as clearly shown in FIG. 3b, in which a numeral 102 denotes an edge of the gate electrode 4. In this case, the source electrode 16 does not cover the entire upper surface of the transistor, that is, a part of the insulating film 5 appears on the surface around the ohmic contact electrodes 21 in the form of C-shaped circular arc grooves, and the circularly concave ohmic contact electrodes 21 are connected to the source electrode 16 through the slender coupling members 22. In this embodiment, the source electrode 16, the ohmic contact electrodes 21 and the coupling members 22 may be made of the same material having the same thickness.

Figure 2:
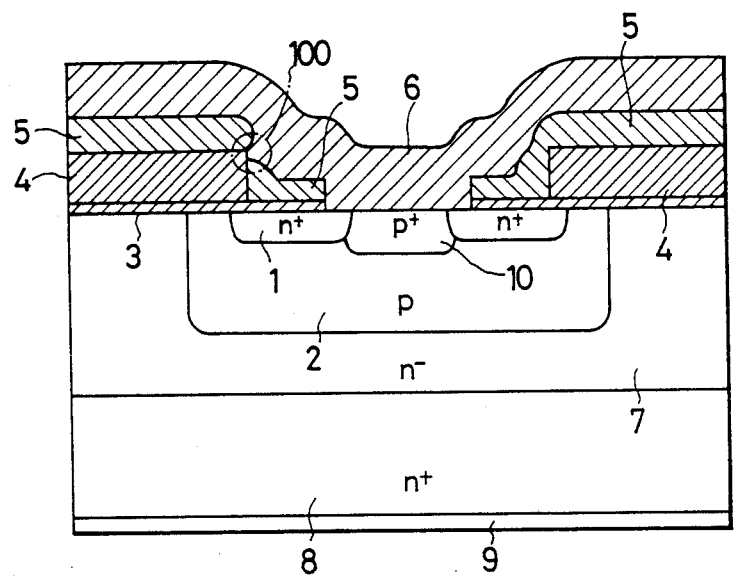
FIG. 2 is an enlarged fragmentary longitudinal cross sectional view of FIG. 1, showing one cell unit.
Figure 4:
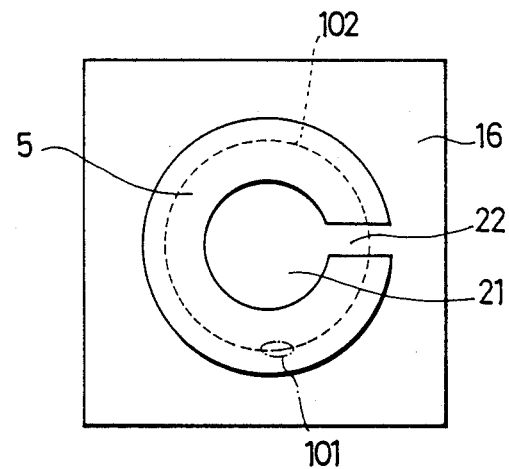
FIG. 4 is an enlarged top plan view of one cell unit for explaining the present invention.

FIG. 4 illustrates one cell unit of the vertical power MOS transistor according to the present inventioln, and there is a step coverage failure portion 101 of the PSG film 5 on the gate electrode edge 102, which corresponds to the short circuit portion 100 in FIG. 2. The step coverage failure portion 101 usually occurs in a part of the gate electrode edge 102.

In this embodiment, the source electrode 16 is separated from the ohmic contact electrodes 21 by the insulating film 5, and the gate electrode edge 102 crosses the narrow coupling member 22 at a quite small part. Hence, the probability of the short circuit between the source and gate electrodes due to the contact of the step coverage failure portion 101 with the coupling member 22 is extremely reduced as compared with the conventional vertical power MOS transistor. Furthermore, the narrower the width off the coupling members 22, the less the probability of the short circuit between the source and gate electrodes.

Figures 5A, 5B:
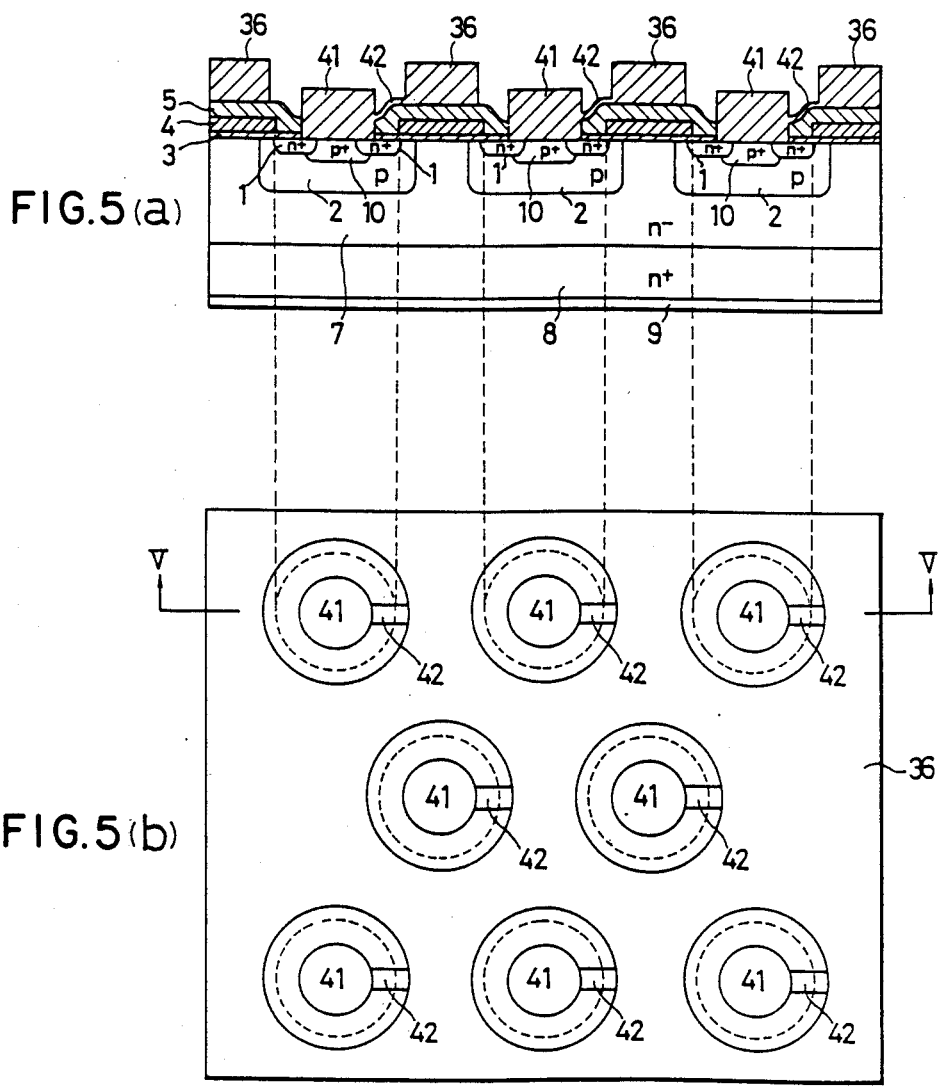
FIGS. 5A and 5B are a longitudinal cross sectional view, taken along the line V—V of a top plan view of another embodiment of a vertical power MOS transistor according to the present invention.

In FIG. 5, there is shown a second embodiment of a vertical power MOS transistor according to the present invention, having the same construction as the one shown in FIG. 3, except that a thickness of narrow coupling members 42 is thinner than that of a source electrode 36 or ohmic contact electrodes 41. The material of the coupling members 42 may be different from that of the source electrode 36 and the ohmic contact electrodes 41. In this embodiment, by thinning the thickness of the coupling members 42, the width of the coupling members 42 can be diminished more easily, and thus the probability of the short circuit between the source and gate electrodes can be largely reduced.

Figure 6:
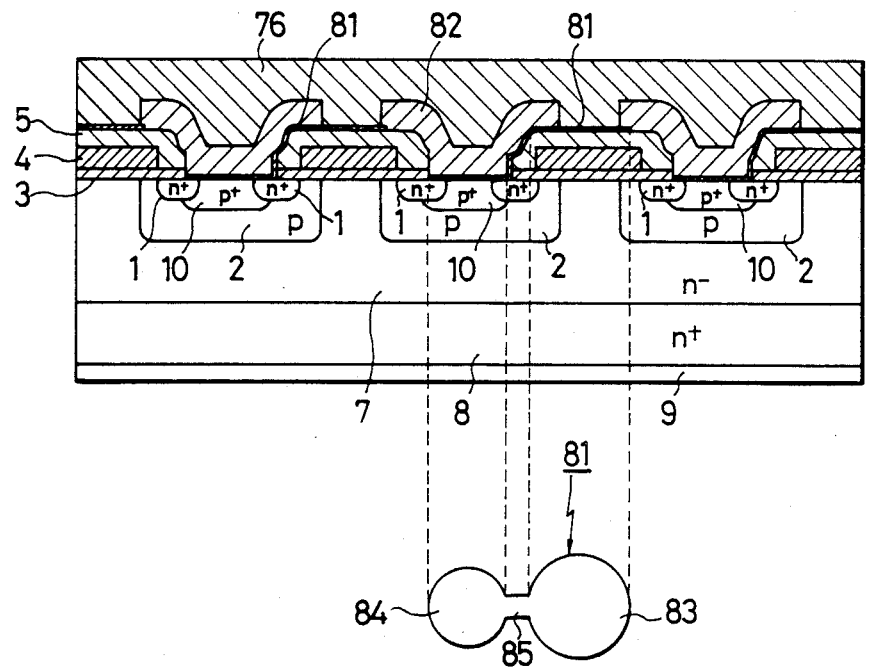
FIG. 6 is a longitudinal cross sectional view of still another embodiment of a vertical power MOS transistor according to the present invention.

In FIG. 6, there is shown a third embodiment of a vertical power MOS transistor according to the present invention. In this case, a thin contact connection electrode 81 includes a circular source electrode contact member 83, a circular ohmic contact electrode member 84 and a narrow coupling member 85 for connecting the source electrode contact member 83 to the ohmic contact electrode member 84. In this embodiment, each thin contact connection electrode 81 is so formed that the source electrode contact member 83 is formed onto the greater portion of the insulating film 5 and that the ohmic contact electrode member 84 is formed onto the circular concave surface of the partial source regions 1 and the high concentration p⁺-type region 10. Then, second insulating films 82 is formed over the surfaces of the contact connection electrodes 81 and the insulating films 5 except the central portions of the source electrode contact members 83 of the contact connection electrodes 81, and then a source electrode 76 is formed on the entire surfaces of the second insulating films 82 and the source electrode contact members 83. In this embodiment, the contact connection electrode 81 performs the roles of the ohmic contact electrode and the narrow coupling member in the first and second embodiments.

As described above, it is readily understood that, since the coupling members for connecting the ohmic contact electrodes to the source electrode across the gate electrode edges are formed as narrow as possible, the occurrence probability of the short circuit between the source and gate electrodes can be extremely reduced, and thus the productivity can be largely improved. Further, since the effective area of the source electrode is reduced, the parasitic capacitance between the source and gate electrodes can be also reduced, and hence the quick operation of the transistor can be possible as compared with the conventional transistor.

What is claimed is:

1. A vertical power MOS transistor, comprising:
   a semiconductor substrate having a first conductivity type, which functions as a drain;
   a channel region having a second conductivity type, formed in the semiconductor substrate;
   a source region having the first conductivity type, formed in the channel region;
   a first insulating film formed over portions of the source region, the channel region and the semiconductor substrate;
   a gate electrode formed on the first insulating film;
   a second insulating film for covering the gate electrode formed on the first insulating film;
   a source electrode formed on the second insulating film except the periphery thereof;
   an ohmic contact electrode formed on parts of the source region and the channel region in the substrate, the ohmic contact electrode being separated from the source electrode; and
   a coupling member for connecting a part of the ohmic contact electrode with the source electrode.

2. The transistor of claim 1, wherein a high concentration region having the second conductivity type is formed in the channel region to connect the ohmic contact electrode with the channel region via the high concentration region.

3. The transistor of claim 1, wherein the thickness of the coupling member is the same as that of the ohmic contact electrode.

4. The transistor of claim 1, wherein the thickness of the coupling member is smaller than that of the ohmic contact electrode.

5. A vertical power MOS transistor, comprising:
   a semiconductor substrate having a first conductivity type, which functions as a drain;
   a channel region having a second conductivity type, formed in the semiconductor substrate;
   a source region having the first conductivity type, formed in the channel region;
   a first insulating film formed over portions of the source region, the channel region and the semiconductor substrate;
   a gate electrode formed on the first insulating film;
   a second insulating film for covering the entire gate electrode formed on the first insulating film;
   a contact connection electrode including a source electrode contact member formed on the second insulating film, an ohmic contact electrode member formed on the portions of the source region and the channel region in the substrate, and a coupling member for connecting a part of the ohmic contact electrode member with the source electrode contact member;
   a third insulating film formed on at least the ohmic contact electrode member and the coupling member of the contact connection electrode and a part of the second insulating film; and
   a source electrode formed on the source electrode contact member except the periphery thereof and the third insulating film, the source electrode being separated from the second insulating film.

* * * * *